United States Patent
Pierrat

(10) Patent No.: US 6,954,911 B2
(45) Date of Patent: Oct. 11, 2005

(54) METHOD AND SYSTEM FOR SIMULATING RESIST AND ETCH EDGES

(75) Inventor: Christophe Pierrat, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 353 days.

(21) Appl. No.: 10/137,828

(22) Filed: May 1, 2002

(65) Prior Publication Data

US 2003/0208728 A1 Nov. 6, 2003

(51) Int. Cl.⁷ .............................................. G06F 17/50
(52) U.S. Cl. .............................. 716/4; 716/19; 716/21; 703/13
(58) Field of Search ................ 716/4, 19, 21; 703/13

(56) References Cited

U.S. PATENT DOCUMENTS

| | | | |
|---|---|---|---|
| 5,282,140 A | 1/1994 | Tazawa et al. | 364/468 |
| 5,326,659 A | 7/1994 | Liu et al. | 430/5 |
| 6,016,357 A | 1/2000 | Neary et al. | 382/144 |
| 6,078,738 A | 6/2000 | Garza et al. | 395/500.22 |
| 6,091,845 A | 7/2000 | Pierrat et al. | 382/144 |
| 6,171,731 B1 | 1/2001 | Medvedeva et al. | 430/5 |
| 6,225,025 B1 | 5/2001 | Hoshino | 430/296 |
| 6,272,236 B1 | 8/2001 | Pierrat et al. | 382/144 |
| 6,339,836 B1 | 1/2002 | Eisenhofer et al. | 716/5 |
| 6,453,457 B1 * | 9/2002 | Pierrat et al. | 716/19 |
| 6,571,383 B1 * | 5/2003 | Butt et al. | 716/19 |
| 6,665,856 B1 * | 12/2003 | Pierrat et al. | 716/19 |
| 6,684,382 B2 * | 1/2004 | Liu | 716/19 |
| 6,704,920 B2 * | 3/2004 | Brill et al. | 716/19 |
| 2002/0019729 A1 | 2/2002 | Chang et al. | 703/6 |
| 2002/0035461 A1 | 3/2002 | Chang et al. | 703/13 |

FOREIGN PATENT DOCUMENTS

| | | |
|---|---|---|
| WO | WO 99/14706 A3 | 3/1999 |
| WO | WO 99/14706 A2 | 3/1999 |

OTHER PUBLICATIONS

Cobb, N., "Fast Optical and Process Proximity Correction Algorithms for Integrated Circuit Manufacturing", Dissertation, University of California at Berkeley, UMI Microform 9902038 (139 pages).

Uhring, W., et al., "Model of an Instrumented Opto–Electronic Transmission System in HDL–A and VHDL–AMS", SPIE, vol. 3893, pp. 137–146, Oct. 1999.

Granik, Y., et al., "Sub–Resolution Process Windows And Yield Estimation Technique Based On Detailed Full–Chip CD Simulation", SPIE, vol. 4182, pp. 335–341 (2000).

Stimiman, J., et al., "Spatial Filter Models to Describe IC Lithographic Behavior", Precim Corporation, Portland, Oregon (10 pages).

Cobb, et al., "Fast Sparse Aerial Image Calculation for OPC", SPIE, vol. 2621, pp. 534–544, Sep. 20–22, 1995.

Kang, D., et al., "Effects of Mask Bias on t he Mask Error Enhancement Factor (MEEF) of Contact Holes" (11 pages).

(Continued)

*Primary Examiner*—Stacy A. Whitmore
(74) *Attorney, Agent, or Firm*—Bever Hoffman & Harms, LLP; Jeanette S. Harms

(57) ABSTRACT

A method of modeling an edge profile for a layer of material is provided. The layer of material can include a resist and/or an etch. In this method, multiple models can be generated, wherein at least two models correspond to different elevations on the wafer. Each model includes an optical model, which has been calibrated using test measurements at the respective elevations. In this manner, an accurate edge profile can be quickly created using the multiple models. Based on the edge profile, layout, mask, and/or process conditions can be modified to improve wafer printing.

12 Claims, 9 Drawing Sheets

OTHER PUBLICATIONS

Adam, K., et al., "Simplified Models for Edge Transitions in Rigorous Mask Modeling", University of California Berkeley (40 pages).

Gordon, R., et al., "Mask Topography Simulation for EUV Lithography", FINLE Technologies Inc. (15 pages).

Pistor, T., "Rigorous 3D Simulation of Phase Defects in Alternating Phase–Shifting Masks", Panoramic Technology Inc. (13 pages).

Semmler, A., et al., "Application of 3D EMF Simulation for Development and Optimization of Alternating Phase Shifting Masks", Infeneon Technologies AG (12 pages).

Erdmann, A., "Topography Effects and Wave Aberrations in Advanced PSM–Technology", Fraunhofer Institute of Integrated Circuits (11 pages).

Neureuther, A., et al., "Modeling Defect–Feature Interactions in the Presence of Aberrations", University of California Berkeley (10 pages).

Mathur, B.P., et al., "Quantitative Evaluation of Shape of Image on Photoresist of Square Apertures", IEEE, Transactions On Electron Devices, vol. 35, No. 3, pp. 294–297, Mar. 1988.

Neureuther, A., "Modeling Phase Shifting Masks", SPIE, 10th Annual Symposium On Microlithography, vol. 1496, pp. 80–85 (1990).

Crisalle, O., et al., "A Comparison of the Optical Projection Lithography Simulators in SAMPLE and PROLITH", IEEE, Transactions On Semiconductor Manufacturing, vol. 5, No. 1, pp. 14–26, Feb. 1992.

Rieger, M., et al., "System for Lithography Proximity Compensation", Precim Company, Portland, Oregon, Sep. 1993 (28 pages).

Pati, Y.C., et al., "Phase–Shifting Masks for Microlithography: Automated Design and Mask Requirements", J. Opt. Soc. Am., vol. 11, No. 9, pp. 2438–2452, Sep. 1994.

Spence, C., et al., "Automated Determination of CAD Layout Failures Through Focus: Experiment and Simulation", SPIE, vol. 2197, pp. 302–313 (1994).

Qian, Q.D., et al., "A New Scalar Planewave Model for High NA Lithography Simulations", IEEE, pp. 45–48 (1994).

Brunner, T., et al., "Approximate Models for Resist Processing Effects", SPIE, vol. 2726, pp. 198–207, Mar. 1996.

Chang, K., et al., "Accurate Modeling of Deep Submicron Interconnect Technology", TMA Times, vol. IX, No. 3 (1997).

Pati, Y.C., et al., "Exploiting Structure in Fast Aerial Image Computation for Integrated Circuit Patterns", IEEE Transactions On Semiconductor Manufacturing, vol. 10, No. 1, pp. 62–74, Feb. 1997.

Brunner, T., "Impact of Lens Aberrations on Optical Lithography", IBM J. Res. Develop., vol. 41, No. 1/2, pp. 57–67, Jan./Mar. 1997.

Tsujimoto, E., et al., "Hierarchical Mask Data Design System (PROPHET) for Aerial Image Simulation, Automatic Phase–Shifter Placement, and Subpeak Overlap Checking", SPIE, vol. 3096, pp. 163–172 (1997).

Schoenmaker, W., et al., "Theory and Implementation of a New Interpolation Method Based on Random Sampling", IMEC Technology Paper, pp. 1–35, Jan. 31, 1997.

Kubota, H., et al., "A Fast Method of Simulating Resist Pattern Contours Based on Mean Inhibitor Concentration", Jpn. J. Appl. Phys., vol. 37, pp. 5815–5820 (1998).

Fukuda, H., et al., "Determination of High–Order Lens Aberration Using Phase/Amplitude Linear Algebra", J. Vac. Sci. Technol. B, vol. 17, No. 6, pp. 3318–3321, Nov./Dec. 1999.

Balasinski, A., et al., "A Novel Approach to Simulate the Effect of Optical Proximity on MOSFET Parametric Yield", IEEE, pp. 37.6.1–37.6.4 (1999).

Balasinski, A., et al., "Comparison of Mask Writing Tools and Mask Simulations for 0.16um Devices", IEEE, SEMI Advanced Semiconductor Manufacturing Conference, pp. 372–377 (1999).

Adam, K., " Domain Decomposition Methods For The Electromagnetic Simulation Of Scattering From Three–Dimensional Structures With Applications In Lithography", University of California Berkeley, College of Engineering, Electronics Research Laboratory, Dec. 20, 2001.

* cited by examiner

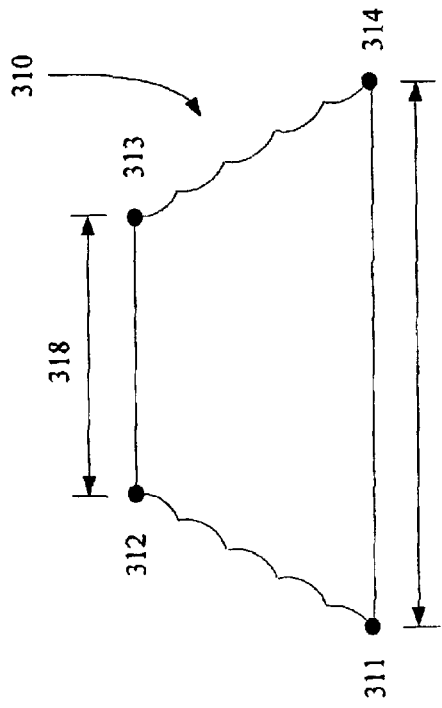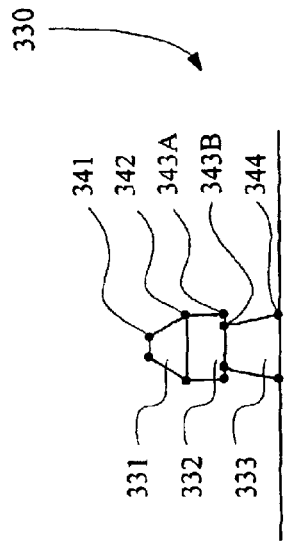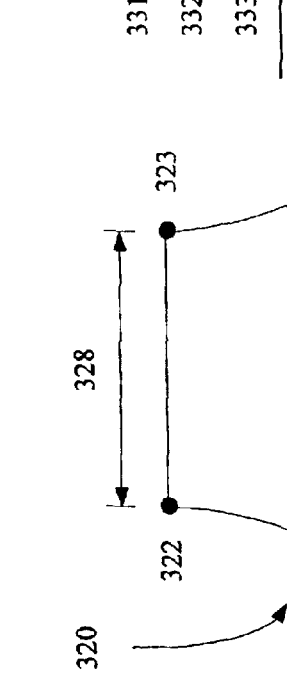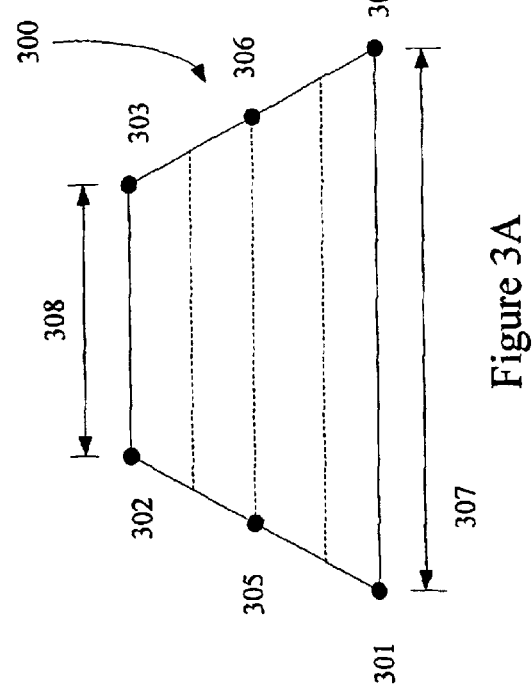

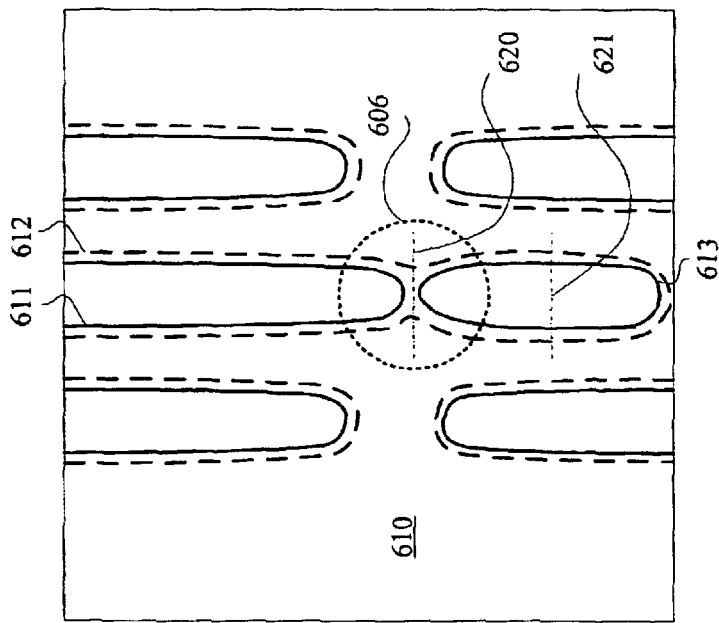
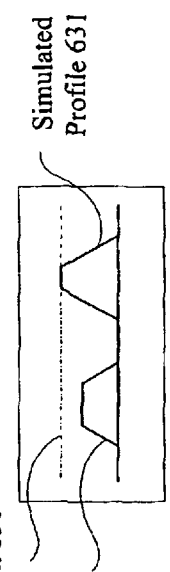
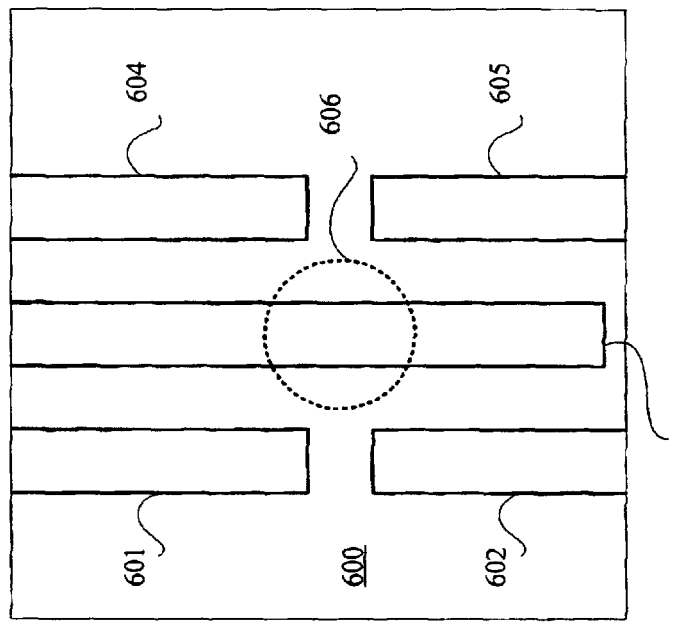
Figure 6A
Figure 6B
Figure 6C

METHOD AND SYSTEM FOR SIMULATING RESIST AND ETCH EDGES

BACKGROUND OF THE INVENTION

1. Field of the Invention

The invention relates to simulating the printing of a pattern onto a wafer and in particular to simulating accurate resist and etch edges.

2. Description of the Related Art

Simulation is the process of predicting a real phenomenon with a set of mathematical formulas, i.e. models. Advanced computer-implemented tools can simulate complex processes, such as integrated circuit (IC) fabrication. In simulating IC fabrication, a simulation tool can use one or multiple models with an input IC design to generate simulation results. Simulation results can be used to modify certain elements, parameters, and/or conditions of fabrication, thereby improving the performance of the IC. For example, simulations can be performed to optimize a layout before fabricating a mask and its corresponding wafer. Logically, having accurate simulation results facilitates making the appropriate changes to the layout and/or mask.

A simulation tool can provide different types of outputs. A first type of simulation output includes a three-dimensional mapping of the intensity in the image plane: $I=f(x,y,z)$, where x and y are the coordinates perpendicular to the optical axis of the stepper and z is the coordinate along the optical access of the stepper. For a given intensity level $I_0$ and a given focal position $z_o$, a contour of the image can be generated, $I_0=f(x,y,z_0)$. This contour is called a simulated optical image.

FIG. 1A illustrates a simulator 104 that can receive layout data 102 representing a layout 101 for generating a simulated optical image 105. Simulator 104 can also receive lithography conditions input 103, which can indicate the lithography conditions under which one or more physical masks for reproducing layout 101 on a wafer of an integrated circuit are to be exposed. Lithography conditions can include, for example, the wavelength of illumination (λ), the numerical aperture (NA), the partial coherency value (σ), the defocus (i.e. focal plane positioning), the exposure level, on/off-axis illumination, lens aberrations, substrate conditions, etc. In one embodiment, lithography conditions input 103 can include a range of these conditions such that the simulation can be performed a number of times for different combinations of these conditions. In this manner, layout data 102 of layout 101 can be analyzed over a range of possible lithography conditions.

Using lithography conditions input 103 and layout data 102, simulator 104 can quickly generate simulated optical image 105, which simulates a wafer being patterned by the masks reproducing layout 101. However, simulator 104 uses very limited input information regarding the resist or etch processes. For example, in one embodiment, simulator 104 merely uses a threshold for the resist in its model(s) to generate simulated optical image 105.

To increase the accuracy of the simulated optical image, additional information regarding the resist and etch processes can be used. For example, in addition to lithography conditions input, a simulator could also receive resist/etch measurements input. In one embodiment, resist/etch measurements can be obtained by exposing a mask, which includes various test patterns, to various lithography conditions that could be used during actual integrated circuit fabrication. The printed features on the corresponding test wafer can then be analyzed for the effects of those lithography conditions on the actual resist/etch profiles of such features.

An atomic force microscope (AFM) can be used for such analysis. An AFM includes a probe with a highly sensitive tip, which can be used to measure the topography of the wafer's surface. In one embodiment, called a contact mode AFM, the tip can be dragged over the surface of the wafer. The probe measures the force applied to the tip by the surface of the wafer, i.e. the greater the height of the resist/etch profile, the greater the force applied to the tip. In another embodiment, called a non-contact mode, the probe can sense Van der Walls attractive forces between the tip and the wafer surface without actually dragging the tip over the wafer's surface.

Another tool for measuring topography is the scanning tunneling microscope (STM). The STM includes a sharp tip connected to a piezoelectric scanner. A small bias voltage can be applied to the wafer. When the tip is brought sufficiently close to the surface of the biased wafer, i.e. within approximately one nanometer, a tunneling current starts to flow between the tip and the wafer. This tunneling current is extremely sensitive to changes in separation of the tip and the wafer. Thus, the STM can measure topography by sensing the variation in tunneling current as the tip is moved over the surface of the wafer.

Yet another tool for measuring topography is the scanning electron microscope (SEM). The SEM uses a beam of high energy electrons, which are focused through a series of electromagnetic lenses, to create a magnified image of the scanned sample, i.e. the wafer surface. Specifically, as the focused electron beam hits the wafer, secondary as well as backscattered electrons are ejected from the wafer. A detector can detect these secondary/backscattered electrons, convert those electrons into corresponding voltages, and apply the voltages to a CRT. Thus, the resulting image of the CRT includes spots of varying intensity, which correspond to the topography of the wafer.

Note that any device capable of providing accurate topography information can be used to measure actual resist/etch profiles of printed features on the wafer. The SEM, which is readily available and easy to use, is generally considered the standard for metrology in most fabrication facilities. However, the measurements output by the SEM are meaningful only if the SEM is calibrated for a given height/elevation of the printed features on the wafer. Moreover, even if the STM or the AFM is used (either of which could provide measurements from various heights/elevations), typically measurements are taken from only one height to build the models. As will be described in further detail below, having limited height/elevation information to build the models can result in some ambiguity in accurately simulating an edge of a feature.

FIG. 2 illustrates a printed wafer 200 including a plurality of printed test patterns 201. Each test pattern can include a set of features of different shapes, critical dimensions (CDs), and feature proximities (i.e. densely populated or isolated). In one embodiment, each test pattern 201 includes identical features, which were exposed to distinct lithography conditions.

Note that in an actual wafer, hundreds of test patterns could be printed by exposing and stepping a reticle across the wafer. Of importance, lithography conditions can be varied for each test pattern. Moreover, each test pattern on the reticle could include thousands or even tens of thousands of features. Therefore, an analysis of a single printed wafer can provide ample resist/etch measurements for building models.

Note that additional wafers can be printed if the range of test patterns and/or lithography conditions increases past the physical limit of a single wafer. For example, different wavelengths of illumination could be used to generate different test wafers. Moreover, various resist and/or etch parameters may be used on different wafers. Resist parameters can include thickness, contrast, pre-bake time, post-bake time, development time, photoresist concentration, developer solution concentration, and light absorption of the resist among others. The etch parameters can include etching time, etching method, and concentration among others.

FIG. 1B illustrates a simulator 106 that can receive lithography conditions input 103 as well as resist/etch measurements input 107 (which could be provided by measuring the resist/etch profiles from printed wafer 200) to generate a simulated calibrated image 108. Note that simulated calibrated image 108 should be more accurate than simulated optical image 105. However, even the calibrated models used by simulator 106 assume that the edges of the features are anisotropically formed. For example, FIG. 1C illustrates an assumed profile 110 of simulated calibrated image 108 at a cut line 109. Assumed profile 110 has vertical sidewalls because, as previously described, the models used by simulator 106 are built using measurements taken from one height/elevation of the wafer.

In actual fabrication, an edge can have significant deviations from a vertical sidewall. To obtain further information regarding these deviations, certain profile simulators can be used. These profile simulators, which can be implemented by the SAMPLE™ tool from University of California, Berkeley or the PROLITH™ toolkit from Finle Technologies, Inc., a subsidiary of KLA-Tencor Corporation, can generate resist and/or etch profiles using pure simulation models that take into account optical as well as resist/etch parameters. The resist/etch parameters could include the complex refractive index of the resist, the dose that the resist gets as a function of depth (wherein because of reflection from the substrate, a standing waves effect occurs), the composition of the resist, the development of the resist, the composition of the material underlying the resist, and the etching of that material. Unfortunately, these calculations are extremely time intensive. Therefore, in a production environment, resist/etch profiles are effectively limited to very small analysis areas. Moreover, these calculations, despite their complexity, still cannot completely capture resist/etch behavior. For example, even subtle variations in chemistry or fabrication environments (e.g. temperature) can dramatically impact processing results. Therefore, the resist/etch profiles generated by the profile simulators can be prone to significant inaccuracy.

Therefore, a need arises for a simulated image generator that can provide an accurate resist/etch edge in a time efficient and cost effective manner.

SUMMARY OF THE INVENTION

In accordance with one feature of the invention, a method of modeling an edge profile for a layer of material is provided. The layer of material can include a resist and/or an etch. In this method, first and second models can be generated. The first model and second models correspond to first and second elevations on the wafer, respectively. Of importance, each model includes an optical model calibrated using test measurements at the respective elevations. In this manner, an accurate edge profile can be quickly created using the first and second models.

A cross-sectional view of this edge profile can be displayed to the user. Based on the edge profile, the user can make appropriate modifications to the layout, mask, and/or process conditions to improve wafer printing. In one embodiment, one or more programs can perform the modifications in an automated or semi-automated fashion.

Edge profiles can have different forms. For example, edge profiles can have substantially straight edges connecting the first elevation to the second elevation. In another example, the edges can represent standing wave patterns. In yet another example, the edges can represent a spline interpolation of at least three points on the edge profile.

In one embodiment, the layer of material comprises a composite layer, which includes a first material and a second material. In such a composite layer, the first and second materials can react differently to etching. To identify this difference, two models can be generated, wherein one model corresponds to the first material and another model corresponds to the second material. Of importance, both models correspond to the elevation on the wafer where the two material contact. To obtain edge profiles for these materials, at least one other model, which corresponds to another elevation, is generated for each material in the composite layer.

In accordance with another feature of the invention, additional models can be generated using various process settings. Process settings can include, for example, defocus, dose, numerical aperture, partial coherence factor, bake temperature, development time, and etch time. In this manner, edge profiles can be compared to determine the effects of different process settings.

In accordance with another feature of the invention, a method of identifying printing problems on a wafer is provided. In this method, models associated with predetermined elevations on the wafer can be built. Each model includes an optical model, which has been calibrated using test measurements at the predetermined elevations. A profile can be generated based on at least two models. This profile facilitates identifying the printing problem.

For example, a maximum height of the profile can be compared with a desired height of a feature. If the maximum and desired heights are different, then a printing problem called feature deterioration is indicated.

In one embodiment, multiple profiles can facilitate identifying the printing problem. For example, a first profile can be generated at a first location on a feature and a second profile can be generated at a second location on the feature. A first maximum height of the first profile can then be compared with a second maximum height of the second profile. If the first and second maximum heights are different, then feature deterioration is indicated.

In another example, a first profile can be generated for a first feature and a second profile can be generated for a second feature. If at least one portion of the first profile touches the second profile, then a printing problem called bridging is indicated.

Note that identifying the printing problem can also include building additional models based on different test conditions. For example, first and second test conditions could include a different defocus. In this example, bridging and/or feature deterioration could be identified by viewing the profiles generated with such models, i.e. those models based on using the different defocus.

In accordance with another feature of the invention, a method of generating design rule checking (DRC) usable data for analyzing printing on a wafer is provided. The method can include dissecting a layout feature into segments. First and second models corresponding to first and second elevations on the wafer can be created. A first contour based on applying the first model to the segments can be generated. Similarly, a second contour based on applying the second model to the segments can be generated. In one embodiment, each segment can include an associated evaluation point. In this case, generating the contour can include computing with the respective model the positions of the evaluation points and connecting the segments to form the contour corresponding to the respective model.

BRIEF DESCRIPTION OF THE FIGURES

FIGS. 3A–3C illustrate exemplary resist/etch profiles of a feature formed from a single layer.

FIG. 3D illustrates an etch profile of a composite layer.

FIG. 6A illustrates a layout including a plurality of features.

FIG. 6B illustrates simulation results for printing the features of FIG. 6A, wherein one printed feature has multiple elevation contours at the same analyzed height, thereby indicating potential feature deterioration.

FIG. 6C illustrates simulated profiles of a feature shown in FIG. 6A at two designated cut lines.

DETAILED DESCRIPTION OF THE FIGURES

Figure 1A:
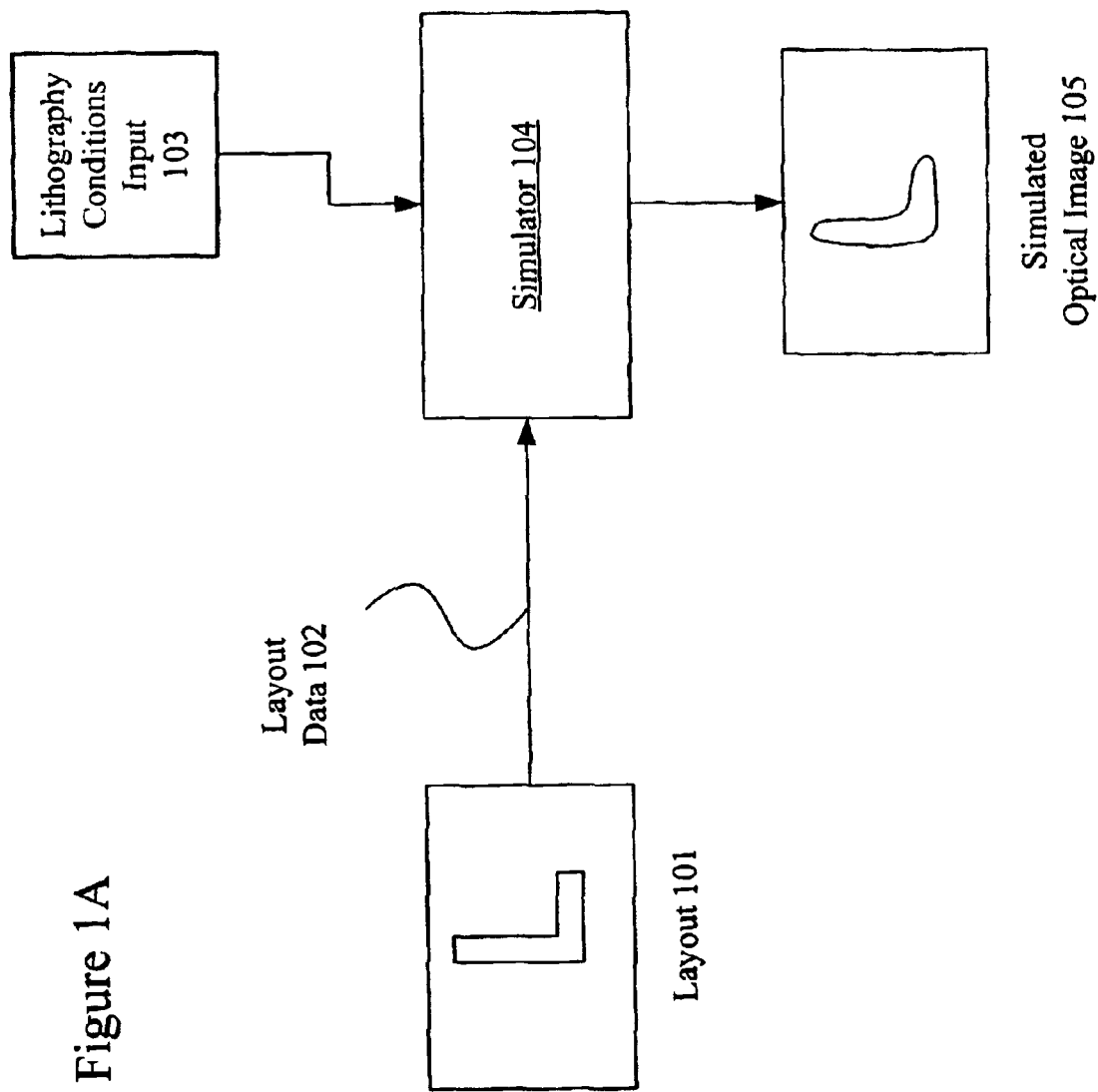
FIG. 1A illustrates a simulator that can simulate an optical image from layout data.
Figure 1B:
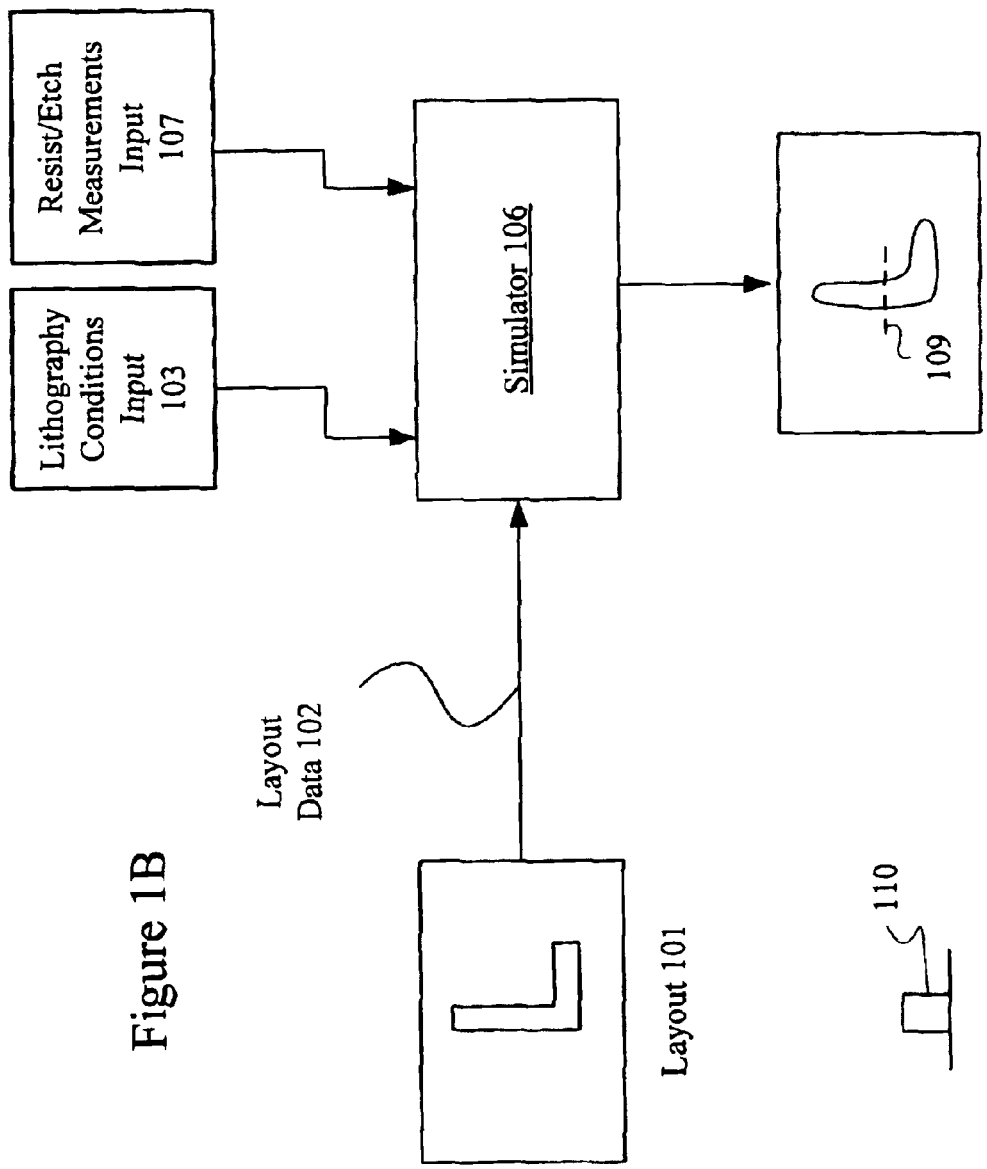
FIG. 1B illustrates a simulator that can simulate a calibrated image from layout data.
Figure 1C:
FIG. 1C illustrates an assumed profile of the simulated calibrated image of FIG. 1B at a designated cut line.
Figure 2:
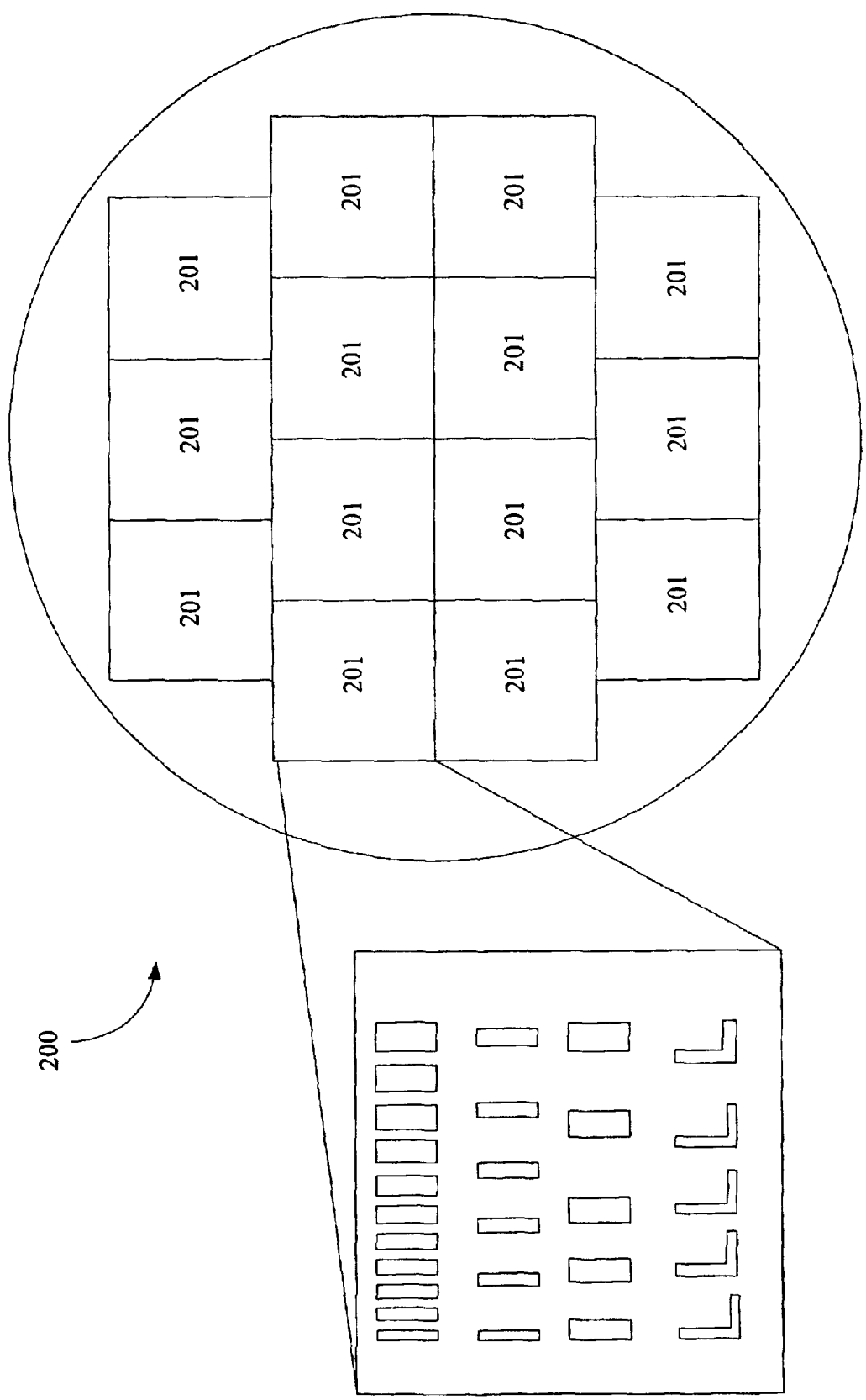
FIG. 2 illustrates a wafer including a plurality of test patterns.

In accordance with one aspect of the invention, multiple models can be built from a test wafer, wherein each model is associated with a certain height of the resist or etch. An accurate profile of the resist and etch in conjunction with a user's layout can be quickly simulated using these multiple models. Elevation contours, also based on these multiple models and provided as simulation output, can help the user solve fabrication problems such as bridging and feature deterioration.

FIG. 3A illustrates a simplified resist/etch profile 300 of a feature, which could be printed on the test wafer. In accordance with one feature of the invention, multiple critical dimensions (CDs) of this feature can be measured to build highly accurate models. For example, one CD 307 can be measured between points 301 and 304 and at least one other CD 308 can be measured between points 302 and 303. Points 301–304 can be detected and corresponding CDs measured by an AFM or another type of topography detection device. Note that additional CDs (indicated by the dashed lines), such as between points 305 and 306, could also be measured using the topography detection device. Identical heights and corresponding CDs for multiple features on the test wafer can be detected. For example, $CD_{top}$ could generically refer to a CD measured at the "top" height established by points 302/303 in FIG. 3, whereas $CD_{bottom}$ could generically refer to a CD measured at the "bottom" height established by points 301/304 in FIG. 3.

In accordance with one feature of the invention, measurements taken in addition to the "top" height/elevation and the "bottom" height/elevation can yield important profile information. For example, FIG. 3B illustrates another exemplary resist/etch profile 310. In resist/etch profile 310, one CD 317 can be measured between points 311 and 314 and another CD 318 can be measured between points 312 and 313. In comparing FIGS. 3A and 3B, points 311–314 correspond substantially to points 301–304, respectively. Note that although CDs 317 and 318 might be substantially equal to CDs 307 and 308, respectively, the profiles can be quite different. Specifically, where profile 300 represents a simplified straight line edge, profile 310 might represent a possible standing wave pattern that could be transferred to the resist/etch edge.

FIG. 3C illustrates another exemplary resist/etch profile 320. In resist/etch profile 320, one CD 327 can be measured between points 321 and 324 and another CD 328 can be measured between points 322 and 323. In comparing FIGS. 3A and 3C, points 301–304 correspond substantially to points 321–324, respectively. Note that although CDs 327 and 328 might be substantially equal to CDs 307 and 308, respectively, the profiles, once again, can be quite different. In this case, profile 320 might represent a spline interpolation of various points (e.g. points 321–324 and other points (shown, but not labeled)).

In accordance with one aspect of the invention, the more CDs that can be measured at different elevations of the wafer, the more accurate the profiles. Note that certain topography detection devices can accurately measure multiple CDs at the same elevation, which can also provide valuable edge information. For example, FIG. 3D illustrates an etch profile 330 of a composite layer comprising layers 331, 332, and 333. In this case, the etch profile of layer 331 can be formed using the CDs at points 341 and 342, the etch profile of layer 332 can be formed using the CDs at points 342 and 343A, and the etch profile of layer 333 can be formed using the CDs at points 343B and 344. Thus, in one embodiment, multiple measurements taken at the same elevation can advantageously yield edge information regarding layer transitions.

Note that FIGS. 3A–3D illustrate exemplary profiles for a feature. Other profiles could have different patterns on opposite edges, whereas yet other profiles could have a top CD that is greater than its bottom CD (in other words, profile 300 could be vertically flipped).

By measuring CDs at multiple heights on the wafer and, in one embodiment, taking multiple CD measurements at the same height on the wafer, the appropriate profile (e.g. one of profiles 300, 310, 320, 330 or some other profile) can be assumed while building the models. In accordance with one feature of the invention, the measured CDs for the test wafer can be organized by heights, thereby facilitating the building of the models. Because they are built from empirical evidence provided by measuring multiple points on the test features, these models can quickly provide extremely accurate simulated profiles. In one embodiment, these simulation results can also advantageously provide at least two elevation contours, wherein each elevation contour can correspond to a predetermined height of analysis. For example, one elevation contour could be based on top CDs, whereas another elevation contour could be based on bottom CDs.

Computer-Implemented Embodiment

Figure 4:
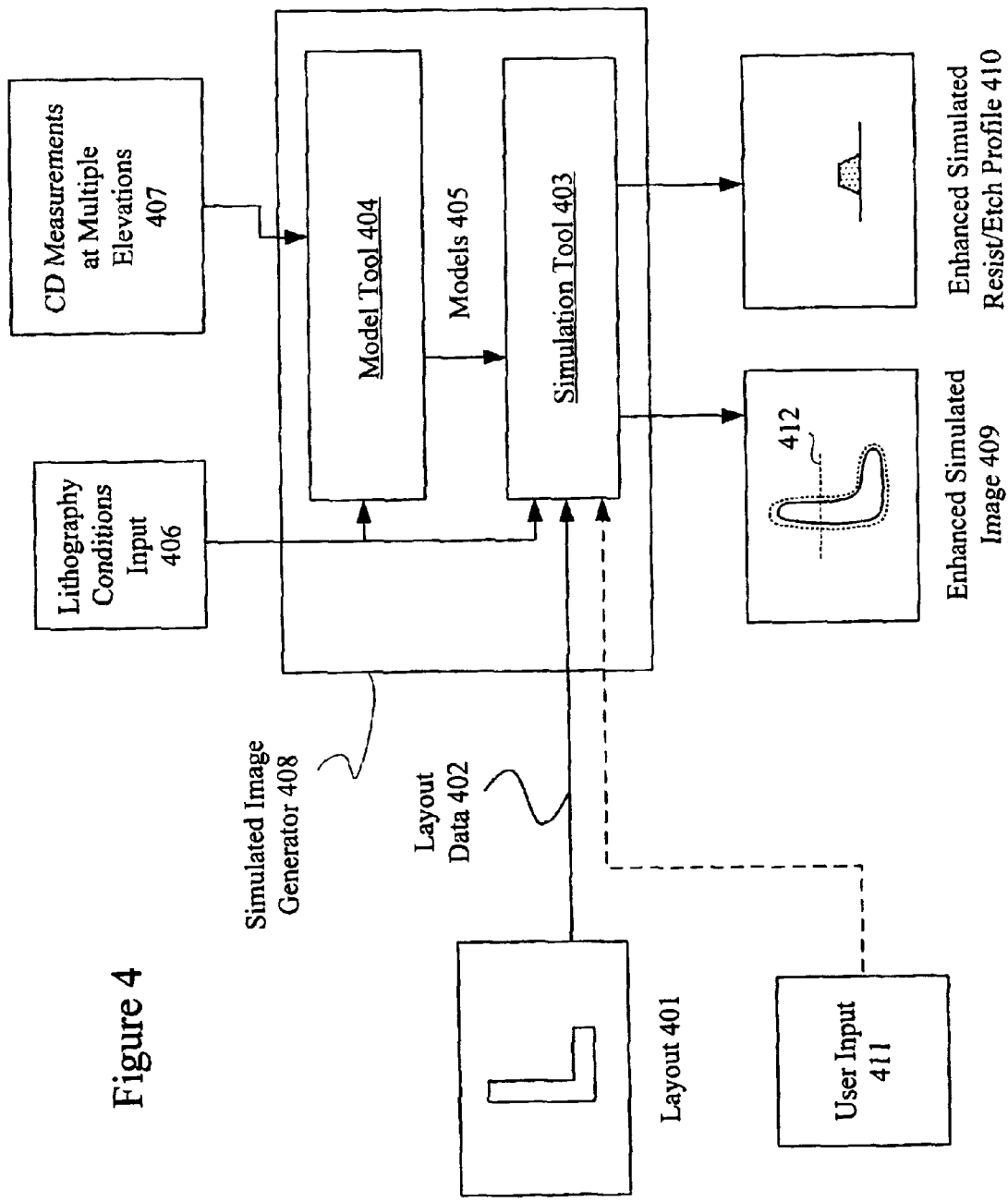
FIG. 4 illustrates a process flow diagram and system for building models with resist/etch results and using such models for generating multiple elevation contours.

FIG. 4 illustrates, in simplified process flow diagram form, one embodiment of the invention that uses multiple elevation resist/etch results for building models, which in turn can be used during simulation. Simulated image generator 408 can include a simulation tool 403 and a model tool 404. In this embodiment, layout data 402 that describes a layout 401 (or portion thereof) is provided as an input to simulation tool 403. Model tool 404 can receive lithography conditions input 406 as well as CD measurements 407 at multiple elevations (which could also include, in one embodiment, multiple measurements at the same elevation). Note that CD measurements 407 could include measurements from the resist and/or the etch.

Model tool 404 can build multiple models 405 using these inputs, wherein each model corresponds to a certain elevation. Simulation tool 403 can use multiple models 405 as well as lithography conditions input 406 to generate an enhanced simulated image 409. (Note that in one embodiment, lithography conditions input 406 may be embedded in models 405, and therefore need not be provided as a separate input to simulation tool 403.) Enhanced simulated image 409 can include multiple elevation contours (two shown in FIG. 4, wherein a solid line indicates one elevation contour, e.g. a contour built from top CDs, and a dashed line indicates another elevation contour, e.g. a contour built from bottom CDs). Note that enhanced simulated image 409 could represent, for example, the top and bottom contours of the resist. Alternatively, enhanced simulated image 409 could represent the top and bottom contours of the etch. Enhanced simulated image 409 could also represent two contours of an etch at the same elevation. In one embodiment, simulation tool 403 can generate N contours in each enhanced simulated image 409, wherein N represents the number of elevation analysis points.

In one embodiment, simulation tool 403 can also generate an enhanced simulated resist/etch profile 410 of enhanced simulated image 409 at a designated cut line 412. As explained in further detail below, cut lines can be positioned both on and between features, thereby facilitating the identification of certain printing problems.

To minimize time resources during simulation, the building of multiple models 405 can precede the input of layout data 402. In one embodiment, a user can input specific lithography conditions, resist parameters, and/or etch parameters (labeled as user input 411) that will be used in an actual lithographic process. To optimize the accuracy of enhanced simulated image 409 and enhanced simulated resist/etch profile 410, user input 411 represents a set of lithography conditions as provided in lithography conditions input 406 and a set of resist/etch parameters as actually used and measured in CD measurements 407. Note that user input 411 can also be input automatically by a system having information regarding those conditions and/or parameters. Note that layout data 402 and user input 411 can be provided in real time or from a storage device.

The simulation program for simulation tool 403 may be run on a variety of computer platforms including: a PC using the Windows™ operating system, either stand alone or connected to a network, and a UNIX™ workstation computer among others. In one embodiment, simulation tool 403 can be implemented by the IC Workbench™ tool and model tool 404 can be implemented by the ModelCal™ tool, both of which are licensed by Numerical Technologies, Inc. Embodiments of the invention can also be incorporated into other tools licensed by Numerical Technologies, Inc. to support design rule checker (DRC) type operations.

In one embodiment, model tool 404 and simulation tool 403 can be run on the same computer. In another embodiment, these tools can run on separate computers, wherein simulation tool 403 could access models 405 and lithography conditions input 406 using a local area network or a wide area network, for example.

Elevation Contours and Enhanced Simulated Profiles

Figure 5B:
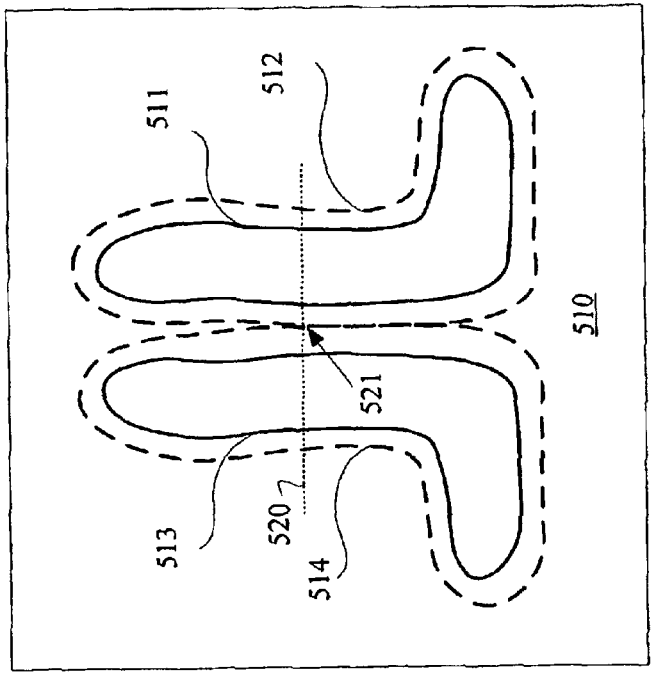
FIG. 5B illustrates simulation results for the printing of the adjacent features in FIG. 5A, wherein elevation contours of the two features touch, thereby indicating potential bridging between the features.
Figure 5C:
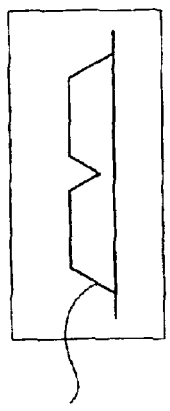
FIG. 5C illustrates a simulated profile of the features shown in FIG. 5A at a designated cut line.
Figure 5A:
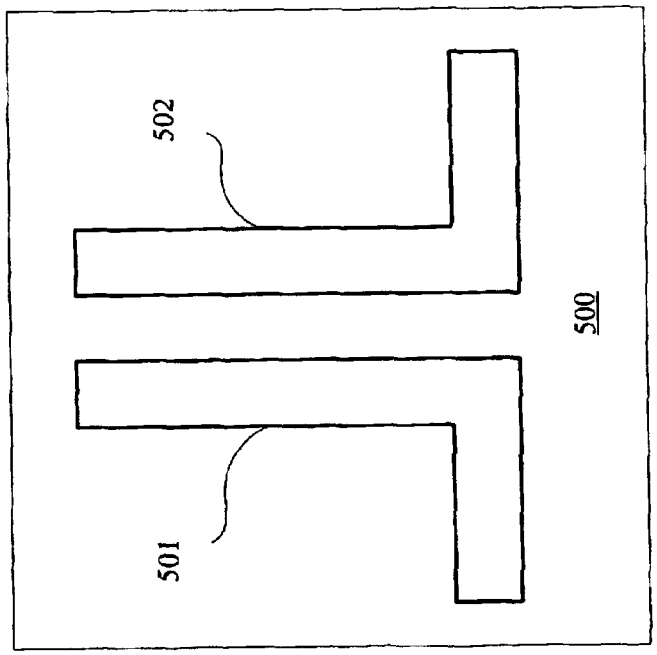
FIG. 5A illustrates a layout including two adjacent features.

FIG. 5A illustrates a simplified layout 500 including two features 501 and 502. Exposing a resist on a wafer using a mask that implements layout 500 can generate a low intensity area between features 501 and 502, thereby potentially causing bridging between these features. Advantageously, bridging or potential bridging can be accurately predicted using elevation contours and enhanced simulated profiles.

For example, FIG. 5B illustrates simulation results 510 for the printing of features 501 and 502, wherein each printed feature has two, associated elevation contours. Specifically, feature 502, after printing, is represented by an elevation contour 511 (which could be derived from the top CDs) as well as an elevation contour 512 (which could be derived from the bottom CDs). Similarly, adjacent feature 501, after printing, is represented by an elevation contour 513 (which could also be derived from the top CDs) as well as an elevation contour 514 (which could also be derived from the bottom CDs).

Of importance, current simulators could assume the printed edges of features 501 and 502 are represented by contours 513 and 511, respectively, thereby not identifying the bridging problem. However, in accordance with one feature of the invention, a system can quickly identify the bridging problem by noting that elevation contour 514 touches elevation contour 512 at location 521, for example. In other words, the bases of the printed features are predicted to touch, thereby creating a "bridge" between the features. Thus, elevation contours can accurately predict a potential bridging problem.

Once a potential bridging problem is identified, the system can notify the user, who can then modify the layout, lithography conditions, and/or resist/etch parameters to correct the problem. In some embodiments, the system may be coupled in communication with one or more programs that can perform the modification in an automated or semi-automated fashion. In such embodiments, user input 411 may dictate the extent to which the programs are able to modify the layout and parameters. Note that a review of bridging areas may be particularly useful for locating areas where optical proximity correction (OPC) should be performed.

In accordance with one feature of the invention, bridging problems can also be identified by viewing one or more enhanced simulated profiles. For example, FIG. 5C illustrates an enhanced simulated profile 530 of features 501 and 502 (FIG. 5A) at a cut line 520 (FIG. 5B). Enhanced simulated profile 530 also indicates that features 501 and 502, instead of having a separation between them, may be joined at their bases.

FIG. 6A illustrates a simplified layout 600 including a plurality of features 601–605. Exposing a resist on a wafer using a mask that implements layout 600 can generate a high intensity area 606, thereby potentially causing deterioration of feature 603 in this area. For example, FIG. 6B illustrates simulation results 610 for the printing of features 601–605, wherein each printed feature has two, associated elevation contours. For example, feature 603, after printing, is represented by elevation contours 611 and 613 (which could be derived from the top CDs) as well as an elevation contour 612 (which could be derived from the bottom CDs).

Of importance, elevation contours 611 and 613 do not touch in area 606. In other words, the simulated printed line formed by feature 603 is disappearing on the top. Such formation, even though still connected on the bottom (as evidenced by contour 612), can result in signal degradation. Thus, elevation contours can also accurately predict a potential feature deterioration problem.

Note that a feature deterioration problem could also be identified by viewing one or more enhanced simulated profiles. For example, FIG. 6C illustrates an enhanced simulated profile 630 of two locations on feature 603 (FIG. 6A), e.g. at cut lines 620 and 621 (FIG. 6B). Enhanced simulated profile 630 (which corresponds to cut line 620) indicates that feature 603 in area 606 has a height significantly less than a desired height 650. In contrast, enhanced simulated profile 640 (which corresponds to cut line 621) indicates that feature 603 in at least one location outside area 606 is predicted to have desired height 650. This disparity in profile height can accurately indicate feature deterioration.

Models Built Using Different Process Settings

Figure 7:
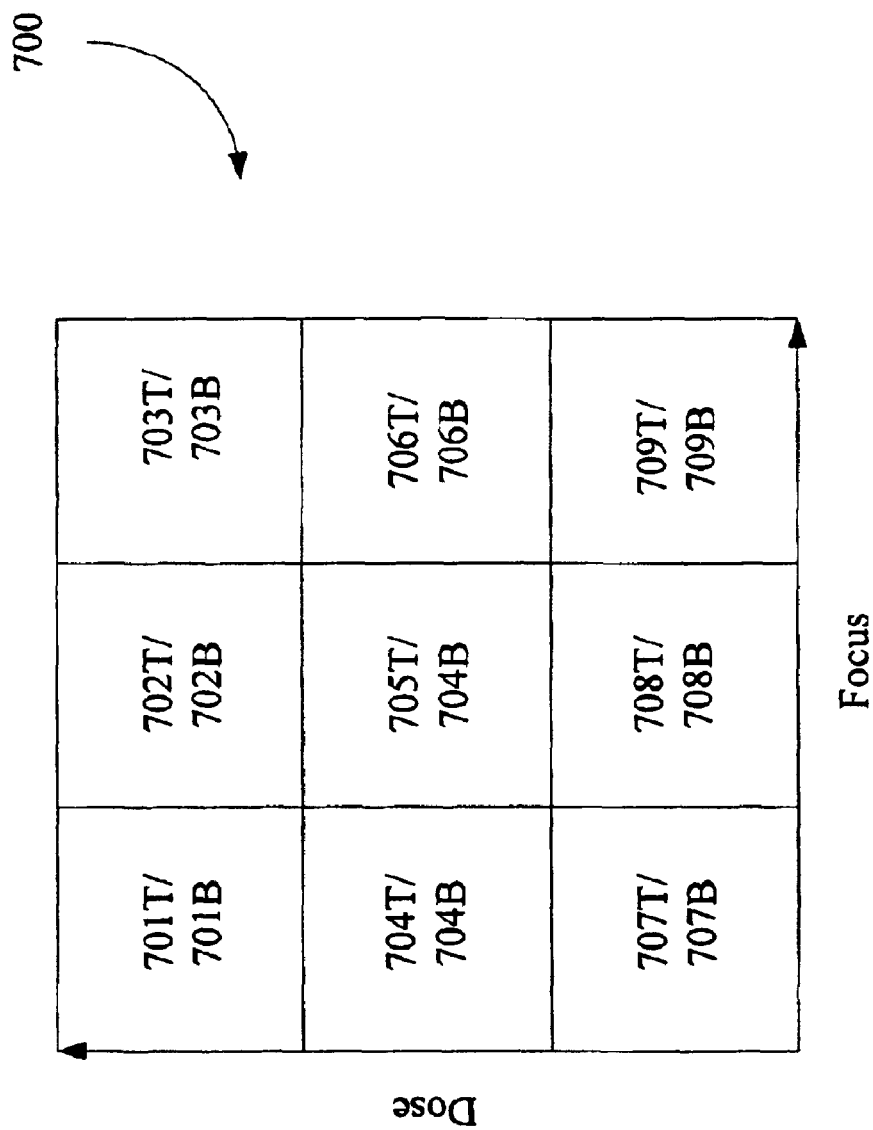
FIG. 7 illustrates a grid of various models associated with different elevations that can be organized by dose (y-axis) and focus (x-axis).

Many models can be built from an analysis of feature profiles on one or more test wafers. For example, FIG. 7 illustrates a grid 700 of various models 701(T/B)–709(T/B) that can be organized by dose (y-axis) and focus (x-axis) (wherein a model based on top CDs includes the alpha designator T and the model based on bottom CDs includes the alpha designator B). Thus, in grid 700, models 705T/705B can be built from a test pattern exposed to a higher dose than models 708T/708B, but having the same focus.

This model grid facilitates a quick identification of issues introduced by process variations. For example, a user can easily compare the effects of using a medium dose with three focus settings by viewing the same features (such as features 501 and 502 in FIG. 5A) simulated with models 704T/704B, 705T/705B, and 706T/706B. Specifically, by comparing simulated images based on models 704B, 705B, and 706B, the user could note that the bridging problem shown in FIG. 5B worsens by increasing defocus.

Note that models can be organized according to other lithography conditions or resist/etch parameters using various process ranges. In one embodiment, models can be built for different process settings including, but not limited to, defocus (e.g. −200 nm, 0, +200 nm), dose (e.g. 20 mJ/cm$^2$, 30 mJ/cm$^2$, 40 mJ/cm$^2$), numerical aperture (e.g. 0.5, 0.6, 0.7), partial coherence factor (e.g. 0.3, 0.4, 0.5), bake temperature (e.g 90° C., 100° C., 110° C. (after exposure)), development time (e.g. 40 s, 50 s, 60 s), and etch time (e.g. 30 s, 40 s, 50 s).

Report Output Formats: Reducing Data Volume

Figure 8C:
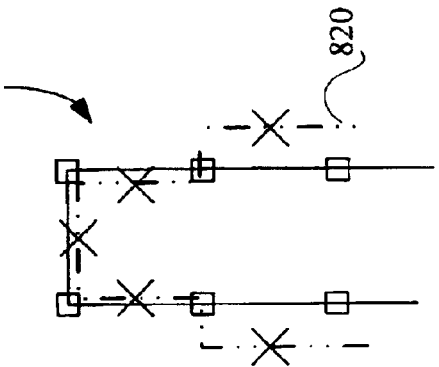
FIGS. 8B–8D illustrate several report output formats that are supported by embodiments of the invention.
Figure 8A:
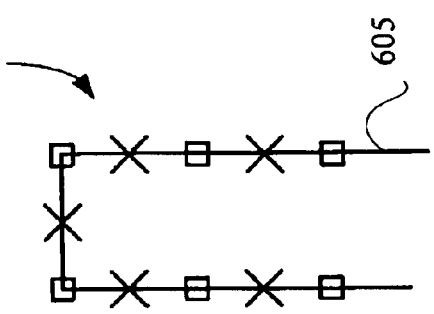
FIG. 8A illustrates a view of an input file including a portion of a feature after dissection points and evaluation points have been added by a simulation tool.
Figure 8D:
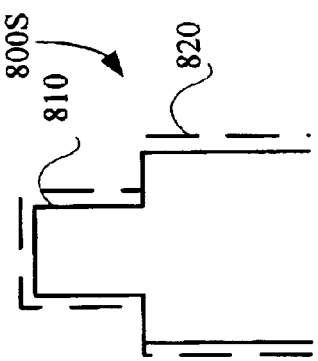
Figure 8B:
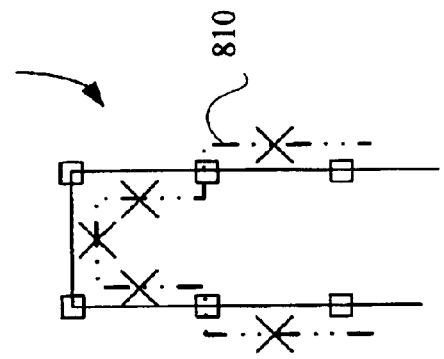

FIG. 8A illustrates a view 800 of an input file including a portion of feature 605 (FIG. 6A) and generated by simulation tool 403. FIGS. 8B–8D illustrate several report output formats 800T, 800B, and 800S, respectively, that are supported by embodiments of the invention. As can be seen in view 800, the input layout has been dissected (e.g. as might be done for proximity effect correction) where feature 605 has been broken into segments (demarcated by open boxes) and at least one evaluation point has been placed on each segment (X marks). Using models 405, it is possible to predict the location of the evaluation points using either or both the top model (format 800T) or the bottom model (format 800B).

More specifically and referring to format 800T, the simulated location of the evaluation points is determined and then connected by a dotted and dashed line, top contour 810. Top contour 810 is a representation of the top contour of feature 605. A similar process can generate the dotted and dashed line, bottom contour 820, shown in format 800B. Either of the two formats 800T or 800B can be provided in the file output.

Depending on user preferences, the original layout may either be included or omitted from the output file. For example, if a GDS-II stream format output is used, then the original layout could be in a first layer, top contour 810 in a second layer, etc. Inclusion of the dissection and evaluation points in the output is similarly optional.

A third alternate format 800S is shown with just the two contours (i.e. top contour 810 and bottom contour 820). Again, depending on the output options selected by the user, all of the contours may be in a single file and then the user may be able to use different viewing tools to selectively visualize the different contours.

Advantageously, this approach reduces data volume relative to the "bitmap" contours shown in FIGS. 5B and 6B. Specifically, top contour 810 and bottom contour 820 can be easily represented as polygonal shapes in GDS-II (or other similar formats). However, there is a slight representational tradeoff caused by the geometrical contour format shown in FIGS. 8B–8D. This is perhaps most visible in format 800S where both top contour 810 and bottom contour 820 are shown overlapping. This is an inherent limitation of the way the contours were constructed and should be understood by any programs or users working off any of the formats shown in FIGS. 8B–8E.

Some advantages of the geometrical contour formats shown in FIGS. 8B–8D include better ability to use existing design tools such as a design rule checker (DRC) on the contour data. This would, for example, allow easy detection of bridging, two contours within a single layer overlapping one another, critical dimension variations outside pre-specified tolerances, etc.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. For example, although the simulated contours of FIGS. 5B and 6B can be generated based on the same test conditions (e.g. lithography conditions and/or resist/etch parameters), these contours could also be generated based on different test conditions. Moreover, the system and methods described herein can be applied to any lithographic process technology, including ultraviolet, deep ultraviolet (DUV), extreme ultraviolet (EUV), x-ray, and ebeam. Accordingly, it is intended that the scope of the invention be defined by the following Claims and their equivalents.

What is claimed is:

1. A method of modeling an edge profile for a layer of material, the method comprising:

generating a first model and a second model, the first model and the second model corresponding to a first elevation and a second elevation on a wafer, respectively, wherein each model includes an optical model calibrated using test measurements at the respective elevations; and creating the edge profile using the first model and the second model, wherein the layer comprises a composite layer, the composite layer including a first material and a second material, wherein the first model corresponds to the first material and the second model corresponds to the first material, and the method further includes:

generating a third model, wherein the third model corresponds to one of the first elevation and the second elevation on the wafer, and wherein the third model corresponds to the second material; and creating a profile using the first, second, and third models.

2. A method of modeling an edge profile for a layer of material, the method comprising:

generating a first model and a second model, the first model and the second model corresponding to a first elevation and a second elevation on a wafer, respectively, wherein each model includes an optical model calibrated using test measurements at the respective elevations; and creating the edge profile using the first model and the second model;

changing at least one processing setting, wherein process settings can include defocus, dose, numerical aperture, partial coherence factor, bake temperature, development time, and etch time;

generating a third model corresponding to one of the first model and the second model, the third model based on changing the at least one processing setting; and creating another edge profile using the third model.

3. A method of modeling an edge profile for a layer of material, the method comprising:

generating a first model and a second model, the first model and the second model corresponding to a first elevation and a second elevation on a wafer, respectively, wherein each model includes an optical model calibrated using test measurements at the respective elevations; and creating the edge profile using the first model and the second model, wherein at least one of the first model and the second model includes multiple models based on different lithography conditions.

4. A method of identifying printing problems on a wafer, the method comprising:

building models based on test measurements, wherein each model is associated with a predetermined elevation on the wafer, and wherein each model includes an optical model calibrated using test measurements at the predetermined elevation;

generating a profile based on at least two models; and identifying a printing problem using the profile, wherein generating the profile includes generating a first profile of a first feature and generating a second profile of a second feature, and wherein identifying the printing problem includes determining that at least one portion of the first profile touches the second profile, thereby indicating bridging.

5. A method of identifying printing problems on a wafer, the method comprising:

building models based on test measurements, wherein each model is associated with a predetermined elevation on the wafer, and wherein each model includes an optical model calibrated using test measurements at the predetermined elevation;

generating a profile based on at least two models; and identifying a printing problem using the profile, wherein generating the profile includes generating a first profile at a first location on a feature and generating a second profile at a second location on the feature, and wherein identifying the printing problem includes comparing a first maximum height associated with the first profile with a second maximum height associated with the second profile, wherein if the first and second maximum heights are different, then feature deterioration is indicated.

6. A method of identifying printing problems on a wafer, the method comprising:

building models based on test measurements, wherein each model is associated with a predetermined elevation on the wafer, and wherein each model includes an optical model calibrated usin test measurements at the redetermined elevation;

generating a profile based on at least two models; and identifying a printing problem using the profile, wherein identifying the printing problem includes comparing a maximum height associated with the profile with a desired height of a feature, wherein if the maximum and desired heights are different, then feature deterioration is indicated.

7. A method of identifying printing problems on a wafer, the method comprising:

building models based on test measurements, wherein each model is associated with a predetermined elevation on the wafer, and wherein each model includes an optical model calibrated using test measurements at the predetermined elevation;

generating a profile based on at least two models; and identifying a printing problem using the profile, wherein identifying the printing problem further includes building additional models based on different test conditions, wherein a first test condition includes a first defocus and a second test condition includes a second defocus, and identifying the printing problem further includes looking for at least one of bridging and feature deterioration based on using the first and second defocus.

8. A system for modeling an edge profile for a layer of material, the system comprising:

means for generating a first model and a second model, the first model and the second model corresponding to a first elevation and a second elevation on a wafer, respectively, wherein each model includes an optical model calibrated using test measurements at the respective elevations; and means for creating the edge profile using the first model and the second model, the means for creating including means for connecting the first elevation to the second elevation;

means for changing at least one processing setting, wherein process settings can include defocus, dose, numerical aperture, partial coherence factor, bake temperature, development time, and etch time;

means for generating a third model corresponding to one of the first model and the second model, the third model based on changing the at least one processing setting; and means for creating another edge profile using the third model.

9. A method of manufacturing an integrated circuit, the method comprising:

building models based on test measurements, wherein each model is associated with a predetermined elevation on the wafer, and wherein each model includes an optical model calibrated using test measurements at the predetermined elevation;

generating a profile based on at least two models;

identifying a printing problem using the profile; and modifying at least one condition in response to the printing problem to improve manufacturing of the integrated circuit, wherein generating the profile includes generating a first profile of a first feature and generating a second profile of a second feature, and wherein identifying the printing problem includes determining that at least one portion of the first profile touches the second profile, thereby indicating bridging.

10. A method of manufacturing an integrated circuit, the method comprising:

building models based on test measurements, wherein each model is associated with a predetermined elevation on the wafer, and wherein each model includes an optical model calibrated using test measurements at the predetermined elevation;

generating a profile based on at least two models;

identifying a printing problem using the profile; and modifying at least one condition in response to the printing problem to improve manufacturing of the integrated circuit, wherein generating the profile includes generating a first profile at a first location on a feature and generating a second profile at a second location on the feature, and wherein identifying the printing problem includes comparing a first maximum height associated with the first profile with a second maximum height associated with the second profile, wherein if the first and second maximum heights are different, then feature deterioration is indicated.

11. A method of manufacturing an integrated circuit, the method comprising:

building models based on test measurements, wherein each model is associated with a predetermined elevation on the wafer, and wherein each model includes an optical model calibrated using test measurements at the predetermined elevation;

generating a profile based on at least two models;

identifying a printing problem using the profile; and modifying at least one condition in response to the printing problem to improve manufacturing of the integrated circuit, wherein identifying the printing problem includes comparing a maximum height associated with the profile with a desired height of a feature, wherein if the maximum and desired heights are different, then feature deterioration is indicated.

12. A method of manufacturing an integrated circuit, the method comprising:

building models based on test measurements, wherein each model is associated with a predetermined elevation on the wafer, and wherein each model includes an optical model calibrated using test measurements at the predetermined elevation;

generating a profile based on at least two models;

identifying a printing problem using the profile; and modifying at least one condition in response to the printing problem to improve manufacturing of the integrated circuit, wherein identifying the printing problem further includes building additional models based on different test conditions, wherein a first test condition includes a first defocus and a second test condition includes a second defocus, and wherein modifying at least one condition includes selecting one of the first and second defocus for manufacturing of the integrated circuit.

* * * * *